United States Patent [19]

Ozeki et al.

[11] Patent Number: 5,057,802
[45] Date of Patent: Oct. 15, 1991

[54] LADDER-TYPE ELECTRIC FILTER APPARATUS AND HOUSING THEREFOR

[75] Inventors: Eiji Ozeki; Kenji Kawakami, both of Nagoya, Japan

[73] Assignee: NGK Spark Plug Co., Ltd., Japan

[21] Appl. No.: 479,536

[22] Filed: Feb. 13, 1990

[30] Foreign Application Priority Data

Feb. 14, 1989 [JP] Japan ................. 1-16047[U]

[51] Int. Cl.$^5$ .......................... H03H 9/10; H03H 9/58
[52] U.S. Cl. .................................. 333/189; 310/348; 174/52.4
[58] Field of Search ............... 333/187, 189, 190, 192; 310/348, 352, 353; 174/52.4, 52.5

[56] References Cited

U.S. PATENT DOCUMENTS 4,864,259  9/1989  Takamoro et al. ............. 310/348 X

FOREIGN PATENT DOCUMENTS 149750  12/1978  Japan ................................. 333/189
72513   6/1981  Japan ................................. 333/189
256201  12/1985  Japan ................................. 310/348

Primary Examiner—Eugene R. LaRoche
Assistant Examiner—Benny Lee
Attorney, Agent, or Firm—Larson & Taylor

[57] ABSTRACT

A ladder-type electric filter apparatus having at least one electric filter unit wherein each electric filter unit includes a casing into which piezoelectric resonator elements and an input, output and earth terminal plates are mounted, one or two of said terminal plates are integrally formed together with the casing, the connecting leg(s) of said terminal plate(s) integrally formed together with the casing are protruded through the wall portion opposite to the opening of the casing, and the remaining terminal plate(s) have a connecting leg(s) protruded from the opening side, all of the connecting legs being connected to a printed circuit board.

4 Claims, 4 Drawing Sheets

LADDER-TYPE ELECTRIC FILTER APPARATUS AND HOUSING THEREFOR

BACKGROUND OF THE INVENTION

The present invention relates to a ladder-type electric filter apparatus for a variety of radio equipments.

It is generally known that such a filter apparatus comprises at least one electric filter unit each of which includes one or more series piezoelectric resonator elements, one or more parallel piezoelectric resonator elements, terminal plates each having a connecting leg and a casing for containing the resonator elements and the terminal plates. It is also known that a filter circuit is normally constructed by successively connecting a plurality of such electric filter units.

Recently, there is an increasing demand for smaller and thinner dimensions of the radio equipment incorporating such a filter apparatus. In order to satisfy this demand, it has been attempted to possibly decrease the height of the filter arrangement by containing only one or a few essential filter units within one casing.

With the conventional electric filter apparatus, each filter unit is mounted on a printed circuit board, connecting terminal legs extended from the casing of each unit are bent toward the printed circuit board and are connected to predetermined conductive lines provided on the board. The connection of each connecting leg to the circuit board is performed at only one side of the casing. That is, each of the connecting terminal legs is extended from only one side wall of the casing and connected to the circuit board by soldering means or inserting it to an associated through hole. However, the fixing of each filter unit to the circuit board does not have sufficient strength because each filter unit is fixed to the circuit board by a cantilever type supporting or one side supporting. Consequently, if the apparatus receives a shock or an impact, the fixed portion may be sprung loose so that the apparatus becomes unstable, or the filter unit may be disconnected from the printed circuit board.

With a view to overcoming these disadvantages, there has been proposed in Japanese U.M. Application No. 63-110142 a filter arrangement in which the connecting legs of a plurality of terminal plates in each filter unit are protruded from the opposite sides of a casing. With this arrangement, since each filter unit is supported at both sides of the casing by soldering the respective connecting legs to a printed circuit board or inserting them into through holes provided on the board, each filter unit can be steadily sustained.

However, in order to extend the connecting legs of the terminal plates, it is generally considered to be necessary to use a casing having openings at both sides. Upon assembling of the filter unit, after a cover plate having one or more holes for passing one or more associated connecting legs of one or more terminal plates is fitted into one opening of the casing, said one or more terminal plates are inserted through the other opening at the opposite side into the casing with the connecting leg(s) thereof being passed through the associated hole(s) in the fitted cover plate, and then each resonator and the remaining terminal plate(s) are inserted into the casing. After the insertion of the components is completed, another cover plate is fitted into the other opening of the casing by insertion of the connecting leg(s) of the remaining terminal plate(s) into one or more holes provided on this cover plate. Finally, filler material is applied to each cover plate.

Furthermore, with this previously proposed arrangement, since the terminal plates are to be inserted into the casing from one side thereof, it is necessary to mount the terminal plate(s) to be first inserted into the casing while the connecting leg(s) of the terminal plates are passed through the hole(s) of the cover plate precedingly fitted into one or opposite opening. It is difficult to insert the connecting leg(s) of the terminal plate(s) from the other side opening into the hole(s) of the cover plate on one opening because each connecting leg may be easily deformed during this procedure. Therefore, this previously proposed arrangement is complicated in its assembling and thus unsuitable for mass-production. Also, since the casing is provided with the openings at the both sides, not only sealing for the openings may be troublesome, but also it may be difficult to obtain full tightness in each sealing portion.

SUMMARY OF THE INVENTION

It is therefore an object of the present invention to provide a ladder-type electric filter apparatus capable of overcoming the problems or disadvantages of the conventional filter arrangements, and being simply assembled and securely mounted on a printed circuit board.

Another object of the present invention is to provide a ladder-type electric filter apparatus which fully meets with the requirement for smaller and thinner dimensions of the radio equipment.

According to the present invention, there is provided a ladder-type electric filter apparatus comprising a ladder-type electric filter apparatus comprising input and output terminal plates and a ground terminal plate, at least one electric filter unit, said at least one filter unit including at least one piezoelectric resonator element forming a series branch between the input and output terminal plates and at least one piezoelectric resonator element forming a parallel branch between the input and output terminal plates and said ground terminal plate, each of said input and output terminal plates and said ground terminal plate having a connecting leg forming an external connecting terminal and mechanically supporting said piezoelectric resonator elements, and said apparatus further comprising a casing for containing said piezoelectric resonator elements, said input terminal plate, said output terminal plate and said ground terminal plate, at least one of said terminal plates being integral with said casing, said casing including an opening in one wall through which each of the terminal plates, except for the at least one integral terminal plate, is mounted, and through which said resonators are mounted, the connecting leg of the at least one integral terminal plate extending from a portion of said casing which is opposite said opening, and the connecting leg of each said other terminal plate extending from said opening.

Each electric filter unit may be securely mounted on a printed circuit board by connecting the connecting legs on associated electrical conductive paths printed on said printed circuit board.

Preferably, either the ground terminal plate or the input and output terminal plates may be integrally provided on the casing by means of an insert molding.

Also, in the ladder-type electric filter apparatus of the present invention, each filter unit may comprise two series piezoelectric resonator elements connected to form a series branch and two parallel piezoelectric resonator element connected to form a parallel branch.

Alternatively, the casing may be formed by connecting two halves to each other with one of the terminal plates therebetween.

The present invention will now be described by way of example with reference to the accompanying drawings:

DETAILED DESCRIPTION

Referring to FIGS. 1 to 6, there is shown a ladder-type electric filter unit according to an embodiment of the present invention, which includes two essential unit circuits.

Figure 1:
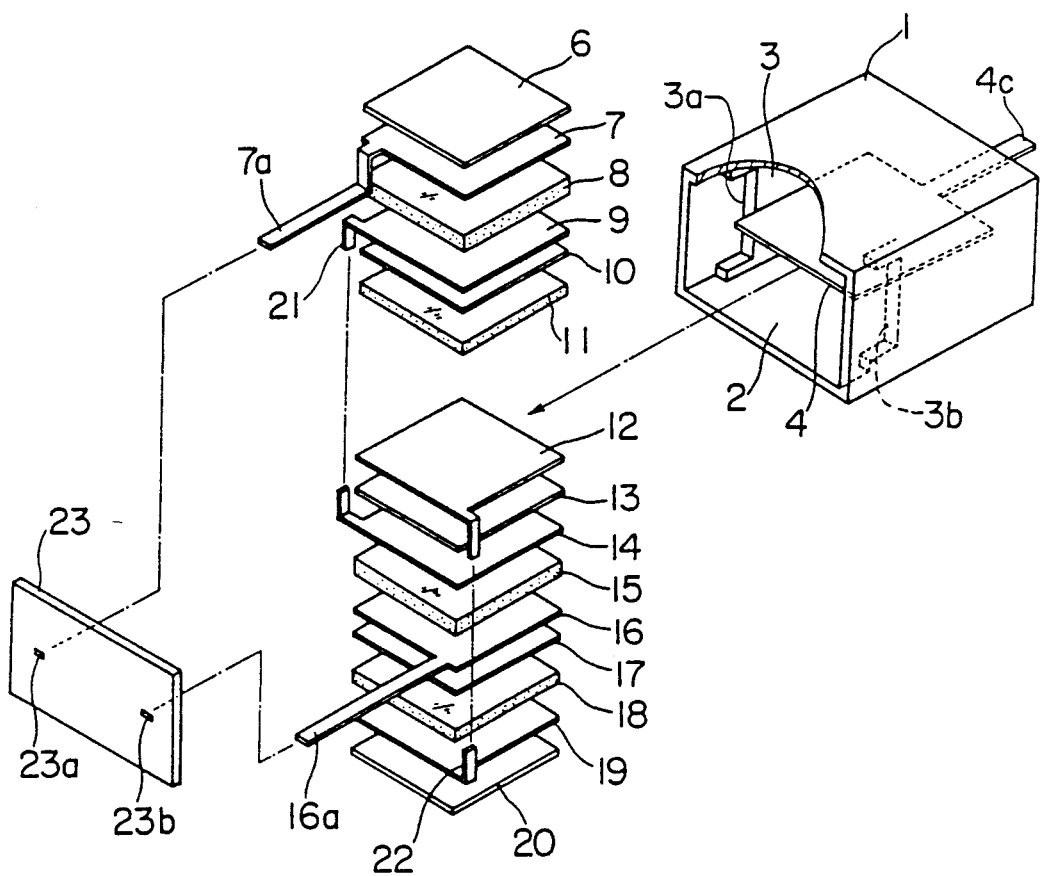
FIG. 1 is an exploded perspective view of one filter unit of an electric filter apparatus according to the present invention.
Figure 2:
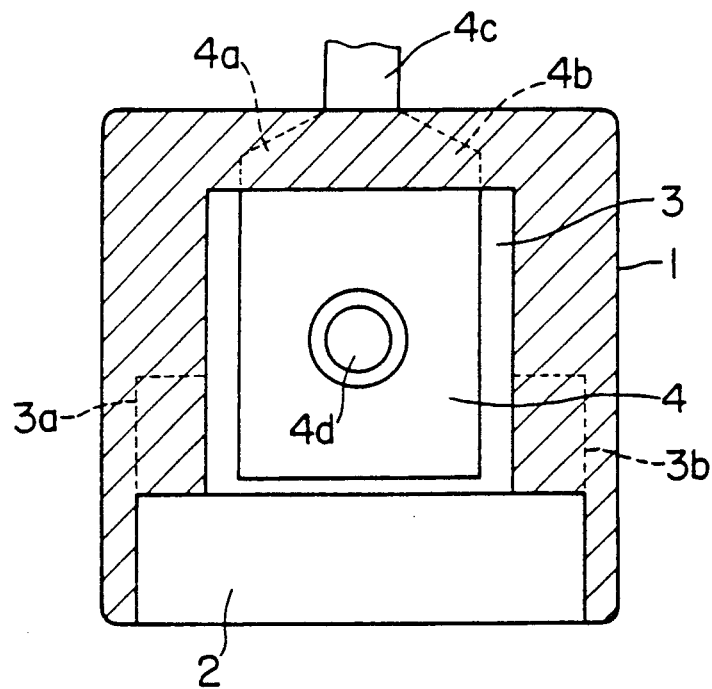
FIG. 2 is a schematic cross section showing a casing formed by an insert molding.

In FIG. 1, the reference numeral 1 represents a box-shape thin casing of an insulating material which has an opening 2 at a front side portion and an inner space 3. The casing 1 is is provided with a ground terminal plate 4 which may be integrally assembled into the inner space 3 by an insert molding. The ground terminal plate 4 has shoulder portions 4a and 4b (see FIGS. 2 and 3) embedded in the rear wall portion of the casing 1, a connecting leg 4c which protrudes outward through the rear wall portion of the casing 1 and a circular arc-shaped protuberant portion 4d. In the forming of the casing 1, the opening 2 and the inner space 3 should be designed so as to make the removing of an inner mold possible. This results in an advantage that the assembly of the casing 1 and the ground terminal plate 4 can be easily formed by a molding process.

Figure 3:
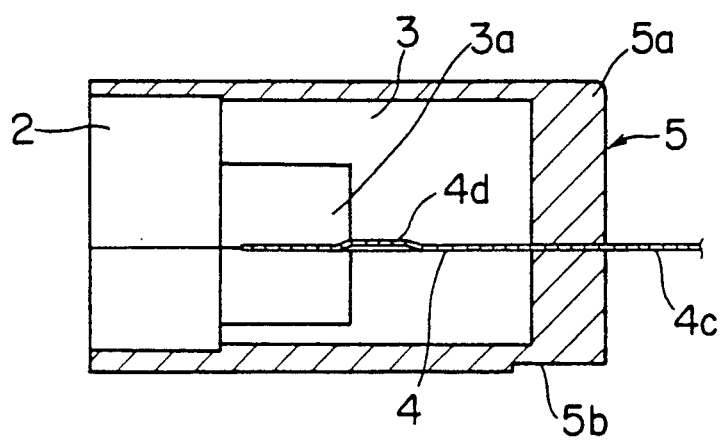
FIG. 3 is a schematic longitudinal section showing another casing formed by superimposing two halves to each other.

Alternatively, the casing may be formed as shown in FIG. 3. That is, FIG. 3 shows a casing 5 which comprises two members 5a and 5b as halves. These members 5a and 5b are separately prepared in advance, positioned facing each other with the ground terminal plate 4 therebetween, and coupled by using an adhesive. In this structure it is possible to design the casing 5 so that the inner space 3 can be suitably shaped.

Within the inner space 3 of the casing 1 there is disposed a filter assembly having a plurality of elements for forming a filter circuit arrangement in a following manner.

As shown in FIG. 1, a first cushioning plate 6, an input terminal plate 7 provided with a connecting leg 7a extending from its front edge, a first thick piezoelectric resonator 8, a first junction terminal plate 9, a first auxiliary terminal plate 10 and a thin piezoelectric resonator 11 are successively inserted through the opening 2 into the upper space portion defined between the top wall portion of the casing 1 and the earth terminal plate 4.

Also, within the lower space portion defined between the bottom wall portion of the casing 1 and the ground terminal plate 4 there are successively disposed a second junction terminal plate 12, an insulating plate 13, a third junction terminal plate 14, a third piezoelectric resonator 15, an output terminal plate 16 provided with a connecting leg 16a extending from its front edge, a second auxiliary terminal plate 17, a fourth piezoelectric resonator 18, a fourth junction terminal plate 19 and a second cushioning plate 20.

The first junction terminal plate 9 is connected to the third junction terminal plates 14 via a connecting strip 21. Similarly, the second junction terminal plate 12 is connected to the fourth junction terminal plates 19 via a connecting strip 22. The connecting strips 21 and 22 are positioned within recesses 3a and 3b which are respectively provided on the side wall portions of the casing 1 near the opening 2 for preventing these connecting strips from contacting with the other elements.

The connecting leg 7a of the input terminal plate 7 is bent as shown in FIG. 1 so that the end portion thereof is substantially positioned at the same level as that of the connecting leg 16a of the output terminal plate 16.

Figure 4:
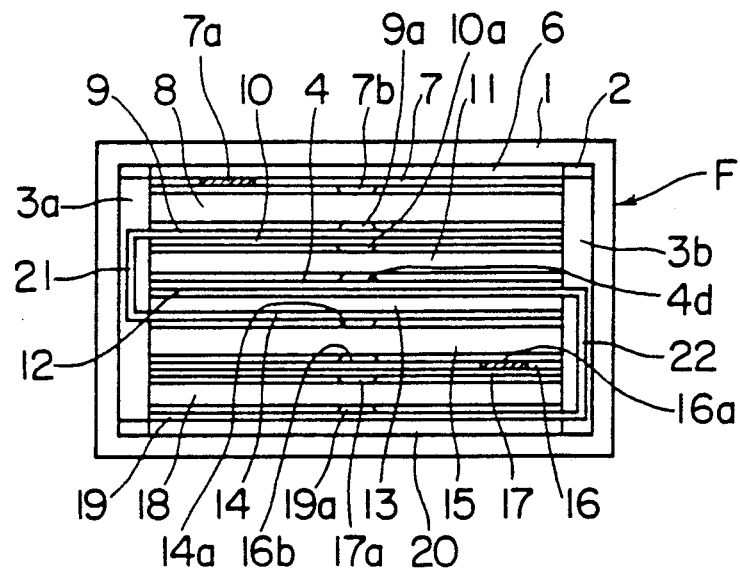
FIG. 4 is a schematic front view showing the electric filter unit when being mounted on the casing.

As shown in FIG. 4, the input and output terminal plates 7 and 16, the first, third and fourth junction terminal plates 9, 14 and 19, and auxiliary terminal plates 10 and 17 have circular arc-shaped protuberant portions 7b, 16b, 9a and 14a, 19a, 10a and 17a which are provided so that respective protuberant portion abuts on the associated vibrating node of the first to fourth piezoelectric resonator elements 8, 11, 15 and 18 upon being assembled. Therefore, these protuberant portions serve to electrically and mechanically support the first to fourth piezoelectric resonator elements 8, 11, 15 and 18.

When the filter unit is assembled, as shown in FIG. 4, one surface of the first thick piezoelectric resonator 8 is connected to the input terminal plate 7 via the protuberant portion 7b integrally provided thereon, and the other surface of the first resonator 8 is connected to the interconnected first and third junction terminal plates 9 and 14 via the protuberant portion 9a of the first junction terminal plate 9. One surface of the second piezoelectric resonator 11 is connected to the interconnected first and third junction terminal plates 9 and 14 via the auxiliary terminal plate 10, and the other surface of second resonator 11 is connected to the ground terminal plate 4 and to the interconnected second and fourth junction terminal plates 12 and 19. One surface of the third resonator 15 is connected to the the interconnected first and third junction terminal plates 9 and 14, and the other surface of this resonator is directly connected to the the output terminal plate 16 to which one surface of the fourth resonator 18 is connected via the auxiliary terminal plate 17, the other surface of the fourth resonator being connected to the interconnected second and fourth junction terminal plates 12 and 19.

In this way, the first and the third piezoelectric resonator 8 and 15 are electrically connected in series between the input and output terminal plates 7 and 16 through the interconnected first and third junction terminal plates 9 and 14. The second and fourth piezoelectric resonators 11 and 18 are connected in parallel between the input and output terminal plates 7 and 16 and are also connected to the ground terminal plate 4. Therefore, the first and third piezoelectric resonators 8 and 15 form a series branch of a filter circuit, and the second and fourth piezoelectric resonators 11 and 19 form a parallel branch of the filter circuit.

After the filter components 6 to 20 are inserted into the casing 1, as shown in FIG. 4, a cover plate 23 (see FIG. 1) is fitted into the opening 2 of the casing 1 by passing the connecting legs 7a and 16a of the input and output terminal plates 7 and 16 through holes 23a and 23b provided on the cover plate 23 before a filler 24 (see FIG. 5) such as epoxy resin is eventually applied into the opening 2. In this connection, in view of full sealing the holes 23a and 23b should be designed to tightly fit to the respective connecting legs 7a and 16a.

In this way, a filter unit generally designated by F may be completed.

Figure 5:
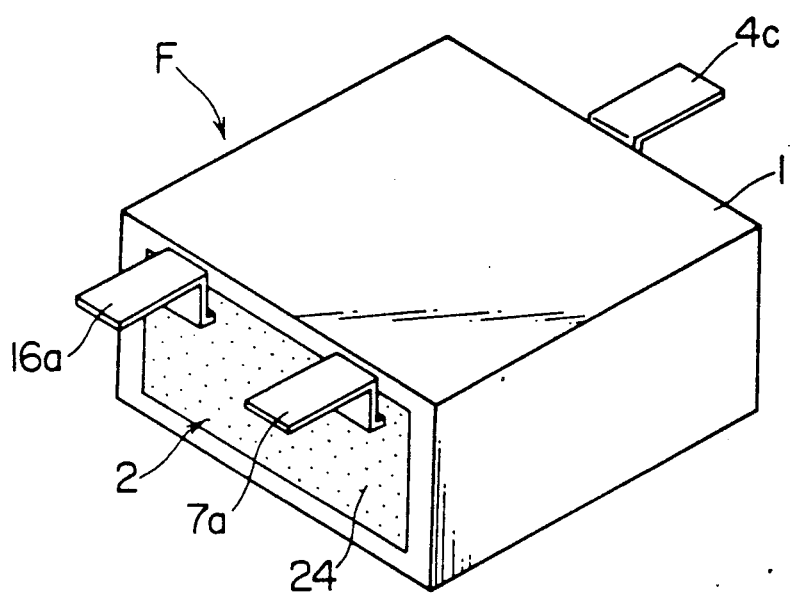
FIG. 5 is a perspective view showing the bottom portion of the electric filter apparatus in which connecting legs are bent.

Then, in order to mount the thus constructed filter unit F on a printed circuit board 25 (see FIG. 6), the input and output connecting legs 7a and 16a as well as the ground connecting leg 4c are bent or offset into a crank or offset shape so that these terminals lie in the same level as the plane of the base surface of the casing 1 as shown in FIG. 5. Since the outer extensions of connecting legs 7a and 16a lie in the same level, the outer extensions may be easily bent with the same die.

Figure 6:
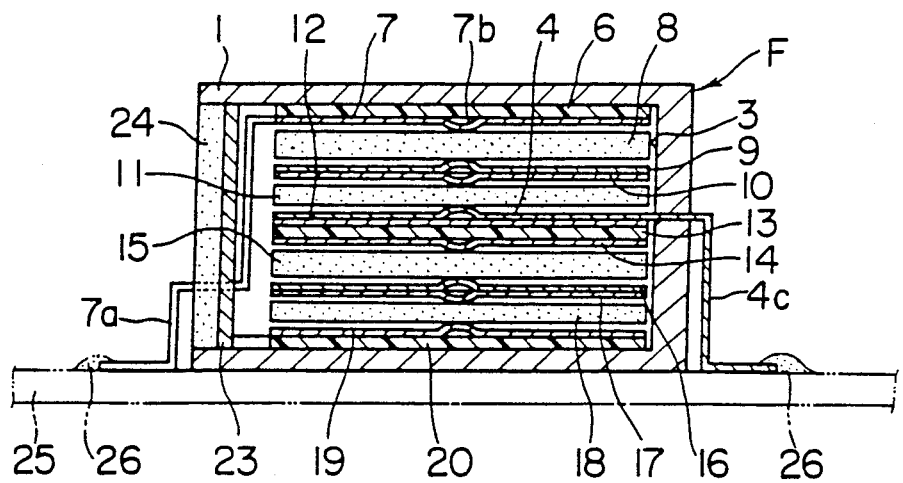
FIG. 6 is a schematic longitudinal section showing the assembled electric filter units.

The filter unit F is disposed on the printed circuit board 25, and the bent input and output connecting legs 7a and 16a and ground connecting leg 4c are connected with predetermined conductor portions provided on the surface of the board 25 by soldering generally designated by the reference numeral 26 as shown in FIG. 6. The filter unit F may be securely sustained at the front and rear sides on the surface of the board 25. In this connection, the outer end of each of the input and output connecting legs 7a and 16a and the ground connecting leg 4c may be inward bent, and in which case the casing 1 may be provided with rectangular recesses for containing the respective bent end portions of the connecting legs substantially at the same level as the plane of the base surface of the casing 1. Alternatively, the outer end of each connecting legs may also be folded.

Instead of soldering, the input, output and earth connecting legs may be respectively connected to the predetermined conductors on the board 25 by fitting them into through holes provided on the respective conductors.

Figure 7:
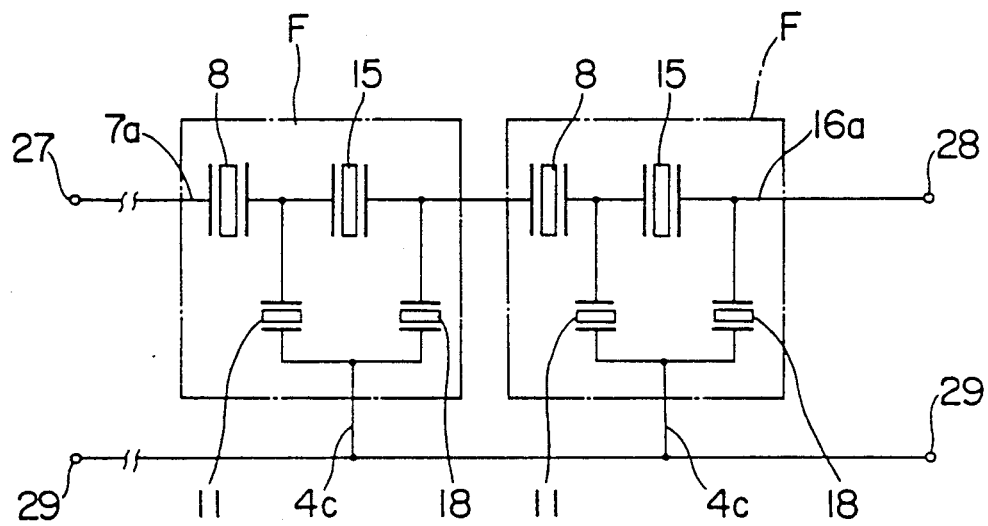
FIG. 7 is an equivalent circuit diagram of an electric filter apparatus constructed by two four-element type filter units.

FIG. 7 shows an equivalent circuit diagram of the ladder-type electric filter apparatus comprising two filter units as constructed in accordance with the illustrated embodiment.

As shown in FIG. 7, the first and third piezoelectric resonators 8 and 15 in each filter unit F are in series connected between input and output terminals 27 and 28 via the input and output connecting legs 7a and 16a. One terminal of the second resonator 11 in each filter F is connected to the connection between the first and third resonators 8 and 15. One terminal of the fourth resonator 18 in the right side filter F is connected to the output terminal 28 via the output connecting leg 16a and one terminal of the fourth resonator 18 in the left side filter F is connected to the connection between the third resonator 15 in the left side filter F and the first resonator 8 in the right side filter F. The other terminals of the second and fourth piezoelectric resonators 11 and 18 in each filter unit F are commonly connected through the earth connecting leg 4c to an ground terminal 29. Two filter units F are cascaded.

With the illustrated embodiments, although the earth terminal plate 4 is integrally formed in the casing 1, it is possible to integrally form the input and output terminal plates 7 and 16 in the casing 1.

The above description has merely referred to an example of a filter device consisting of two essential filter units each of which comprises two series resonators connected in series and two parallel resonators. However, the preferred embodiment allows one or three resonator elements each for series and parallel branches to be assembled in the same casing. Therefore, present invention may be applied to any filter device in which any number of filter units are provided.

As described above, according to the present invention the connecting legs are extended from the both sides, that is, the front side and the rear side of the casing, and are connected with the printed circuit board. Also, one or more terminal plates each having the connecting leg can be integrally assembled in the casing, and the remaining terminal plate(s) can be inserted into the casing upon the assembling of each filter unit. It is, therefore, possible to reduce or shorten the number of the steps required in assembling, thus making the assembling of the filter unit easy. This leads to the decrease of the cost of a filter apparatus.

Further, since the casing has an opening only at one side, sealing for the opening can be easily and fully performed.

The provision of the connecting legs on the both sides of the casing permits a steady supporting for the filter unit.

It is to be understood that the above-mentioned embodiments are only illustrative of the application of the principles of the present invention. Numerous modifications and alterations may be made by those skilled in the art without departing from the spirit and scope of the invention, and the appended claims are intended to cover such modifications and alterations.

What is claimed is:

1. A ladder-type electric filter apparatus comprising input and output terminal plates and a ground terminal plate, at least one electric filter unit, said at least one filter unit including at least one piezoelectric resonator element forming a series branch between the input and output terminal plates and at least one piezoelectric resonator element forming a parallel branch between the input and output terminal plates and said ground terminal plate, each of said input and output terminal plates and said ground terminal plate having a connecting leg forming an external connecting terminal and mechanically supporting said piezoelectric resonator elements, and said apparatus further comprising a casing for containing said piezoelectric resonator elements, said input terminal plate, said output terminal plate and said ground terminal plate, at least one of said terminal plates being integral with said casing, said casing including an opening in one wall through which each of the terminal plates, except for elements are mounted, the connecting leg of the at least one integral terminal plate extending from a portion of said casing which is opposite said opening in said one wall, and the connecting leg of each said other terminal plate extending from said opening.

2. A ladder-type electric filter apparatus as claimed in claim 1, wherein said casing comprises two halves which are connected to each other with one of said terminal plates being disposed between said two halves.

3. A ladder-type electric filter apparatus as claimed in claim 1, wherein said ground terminal plate is integral with the casing.

4. A ladder-type electric filter apparatus as claimed in claim 1, wherein each filter unit comprises two series piezoelectric resonator elements which are connected in series between said input and output terminal plates so as to form said series branch and two parallel piezoelectric resonator elements which are connected in parallel between said input and output terminal plates and said ground terminal plate so as to form said parallel branch.

* * * * *